(12) United States Patent
Brewer et al.

(10) Patent No.: US 7,105,376 B1
(45) Date of Patent: Sep. 12, 2006

(54) SELF-LOCATION METHOD AND APPARATUS

(75) Inventors: Peter D. Brewer, Westlake Village, CA (US); Clifford A. Lebeau, Newbury Park, CA (US); Andrew T. Hunter, Woodland Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 227 days.

(21) Appl. No.: 10/888,178

(22) Filed: Jul. 8, 2004

Related U.S. Application Data

(60) Provisional application No. 60/490,194, filed on Jul. 25, 2003.

(51) Int. Cl.
*H01L 21/50* (2006.01)
*H01L 21/48* (2006.01)
*H01L 21/46* (2006.01)

(52) U.S. Cl. .................. 438/107; 438/455; 438/800

(58) Field of Classification Search .................. None
See application file for complete search history.

(56) References Cited

U.S. PATENT DOCUMENTS

| | | | | |
|---|---|---|---|---|
| 5,904,545 | A | 5/1999 | Smith et al. | 438/455 |
| 6,780,696 | B1 * | 8/2004 | Schatz | 438/216 |
| 6,790,692 | B1 * | 9/2004 | Onozawa | 438/28 |
| 6,919,641 | B1 * | 7/2005 | Onozawa et al. | 257/777 |

OTHER PUBLICATIONS

Cohn, M.B., et al., "Microassembly Tehnologies for MEMS," *SPIE Micromachining and Microfabrication, Conference on Micromachining and Microfabrication Process Technology IV*, Santa Clara, CA, 15 pages total (Sep. 21-22, 1998).

Gracias, D.H., "Forming Electrical Networks In Three Dimensions by Self-Assembly," *Science*, vol. 289, pp. 1170-1172 (Aug. 18, 2000).

Hadley, M.A., "Vertical-Cavity Surface-Emitting Laser Diodes: Design, Growth, Mode Control and Integration by Fluidic Self-Assembly," *UMI Dissertation Services*, Sections 5.4, 5.5, and 5.6, pp. 75-81 (1994).

Saitou, K., et al., "Externally Resonated Linear Microvibromotor For Microassembly," *Journal of Microelectromechanical Systems*, vol. 9, No. 3, pp. 336-346 (Sep. 2000).

Srinivasan, U., et al., "Microstructure to Substrate Self-Assembly Using Capillary Forces," *Journal of Microelectromechanical Systems*, vol. 10, No. 1, pp. 17-24 (Mar. 2001).

Terfort, A., et al, "Self-Assembly Of An Operating Electrical Circuit Based On Shape Complementarity And The Hydrophobic Effect," *Advanced Materials*, vol. 10, No.6, pp. 470-473, (1998).

Terfort, A., et al., "Three-dimensional Self-assembly of Millimetro-Scale Components," *Nature*, vol. 386, pp. 162-164 (Mar. 13, 1997)

\* cited by examiner

*Primary Examiner*—Luan Thai
(74) *Attorney, Agent, or Firm*—Ladas & Parry LLP

(57) ABSTRACT

A method and apparatus for transporting and dispersing microstructures on a substrate by fluidic self-assembly. The apparatus has an assembly vessel that is tilted and rotated to apply uncaptured microstructures back onto the substrate as the assembly vessel rotates. The assembly vessel has ramp structures that collect the microstructures that have not been captured by the substrate at the lower edge of the assembly vessel, carry the microstructures as the assembly vessel rotates, and release the microstructures back on to the substrate at the upper edge of the assembly vessel. Vibrational energy may also be applied to the assembly vessel to assist in the dispersal and location of the microstructures on the substrate.

21 Claims, 11 Drawing Sheets

SELF-LOCATION METHOD AND APPARATUS

CROSS-REFERENCE TO RELATED APPLICATIONS

The present application is related to and claims benefit under 35 U.S.C. 119(e) of copending U.S. Provisional Application No. 60/490,194, titled "Self-Location method and Apparatus," filed Jul. 25, 2003. The contents of U.S. Provisional Application No. 60/490,194 are incorporated herein by reference in their entirety.

BACKGROUND

1. Field

The present disclosure relates to a method and apparatus for assembly of device, integrated circuit, and/or passive components on a substrate to provide hybrid electronic, optoelectronic, or other types of integrated systems. For example, the present disclosure describes a method and apparatus for transporting and dispersal of microstructures by fluidic self-assembly onto a substrate wafer.

2. Description of Related Art

Increasingly complex integrated electronic and optoelectronic systems require larger numbers of integrated circuits and devices to implement increasingly complex system functions. However, to achieve cost and weight goals, it is preferred that these integrated systems be implemented with as few separate device structures as possible. One approach is to fabricate all of the integrated circuits and devices on a single wafer or portion of a wafer, which provides the structural base for the system and minimizes the interconnect distances between circuits and devices. Such fabrication may be referred to as "wafer-scale" integration.

Many complex integrated electronic and optoelectronic systems require the use of integrated circuits and devices that utilize different semiconductor technologies. One approach known in the art for wafer-scale integration of different semiconductor technologies is heteroepitaxy. The heteroepitaxy approach may limit the number of different devices and material systems that can be successfully integrated. Moreover, growth and fabrication procedures optimized for a single device technology often must be compromised to accommodate dissimilar material systems. Finally, testing of individual portions of the integrated system may be made difficult by the fabrication techniques used to accommodate dissimilar material systems on a single wafer.

Since it may be difficult to fabricate high performance systems with multiple types of devices using heteroepitaxy approaches, it may be preferable to fabricate separate arrays of devices or circuit modules and couple these separately fabricated components to a host wafer. This approach allows each individual component to have state-of-the-art performance and high yield (due to pre-testing). Each component may use proven device and circuit architectures, while optimum epitaxial growth and/or device processing sequences are employed to fabricate each component.

The separate components may be individually integrated with the host wafer using any one of several established methods for chip-level integration. These methods generally rely upon surface-mounting techniques for attaching complete die assemblies using solder bumps or wire bonding. The most advanced of these methods is the "flip-chip" technique that can support integration of a wide variety of device technologies and fully utilizes the costly, high-performance device wafer real estate. However, flip-chip is generally limited to relatively large size components, typically greater than 1 square millimeter, and is inefficient for the placement of large numbers of components due to its serial nature.

Pick-and-place assembly techniques for positioning components with sizes less than a millimeter on a substrate are known in the art. See, for example, Saitou et al., "Externally Resonated Linear Microvibromotor for Microassembly," *J. Microelectromech. Syst.*, vol. 9, pp. 336–346, September 2000. However, these techniques are known to suffer limitations due to the surface adhesion forces based on the extremely small size of the components. Further, these techniques are also inefficient for the placement of large numbers of components, again due to the serial nature of the techniques.

At the wafer-scale level, self-assembly methods generally provide the best capability to allow integration of arbitrary configurations and densities of components. The most advanced of the self-assembly methods use a fluid medium to transport components to a host substrate or wafer for assembly. Two different fluidic self-assembly methods are known in the art, which differ in the underlying mechanism used to locate, position, and connect the components on the host substrate or wafer.

The first method of fluidic self-assembly uses gravitational forces and geometrical constraints to integrate components with a host substrate. The components are fabricated with specific shapes and complementary shaped receptacles are formed on the substrate for receiving the shaped components. The components are typically formed using semiconductor fabrication techniques and the receptacles are formed by using wet or dry etching techniques. A solvent such as water or ethanol is used to transport the individual components to the host substrate with the receptacles. The receptacles trap the components, which come to rest in predictable orientations due to their specific shapes. The driving potential is primarily gravitational in origin, but the fluid and surface forces may also play a role in the assembly process.

The second method of fluidic self-assembly utilizes chemically-based driving forces to govern the assembly process, where the attraction, positioning, orientation, and ordering of components is controlled by molecular interactions at the surfaces of the components and the host substrate. Molecular-based self-assembly techniques generally use surface coatings that consist of chemically-bonded films which are either hydrophobic or hydrophilic by nature. Thermodynamic driving forces control the assembly of complex arrays of components by minimizing the surface energies of the components and host substrate.

Both methods may be used together to provide for integration of electronic and opto-electronic devices into hybrid electronic systems. See, for example, A. Terfort, et al., "Self-Assembly of an Operating Electrical Circuit Based on Shape Complementarity and the Hydrophobic Effect," *Adv. Material,* 10, No. 6, 1998, pp. 470–473. See also A. Terfort, et al., "Three-dimensional Self-Assembly of Millimeter-scale Components," *Nature*, Vol. 386, Mar. 13, 1997, pp. 162–164.

Various apparatus and methods are known in the art for assembling microstructures onto a substrate through fluid transport. For example, U.S. Pat. No. 5,904,545, issued on May 18, 1999, to Smith et al. describes an apparatus used for fabricating electronic systems using fluidic self-assembly methods. A schematic of the apparatus is depicted in FIG. 1.

The Smith apparatus, as shown in FIG. 1, consists of a vessel that contains the substrate that is to receive the microstructures, a fluid medium with the microstructures therein, and a pumping system. The pumping system uses gas bubbles to circulate the fluid and microstructures throughout the system. A funnel shaped drain collects and concentrates the microstructures that have not been assembled onto the substrate, and directs them for recirculation to a column where bubbles are injected. The bubbles push the fluid and microstructures up the return line and the fluid containing the microstructures is then redispersed over the substrate through the spout. Changing the gas flow into the return line controls the pump rates.

However, problems associated with assembling microstructures using the Smith apparatus are reported in the Ph.D. thesis of Mark Hadley (University of California—Berkeley, 1994). In that thesis, it is disclosed that tests were performed using large (1.2 mm×1.0 mm×0.235 mm) and small (150 micron×150 micron×35 micron) microstructures with substrates having complementary shaped receptacle holes. Assembly tests were performed with the Smith apparatus using 500 large Si blocks with a substrate having 191 receptacles. Tests were also performed with 30,000 small Si blocks with a substrate having ~4096 receptacles. When using water as the transport fluid, bubbles were found to attach to the Si blocks causing them to float. For the larger blocks, the addition of a surfactant, which altered the surface properties of the microstructures, was found to stop the attachment of the bubbles. However, smaller microstructures could not escape the forces at the water/air interface. Assembly of small microstructures required non-aqueous media such as ethanol or methanol. The results disclosed in the Hadley thesis were based on the use of a gravity-based process that employed shape matching between the microstructure blocks and the substrate receptacles.

As briefly mentioned above, other procedures for assembling microstructures do not rely on gravity to aid the placement of the microstructures on the substrate. Some procedures employ selective surface coatings (i.e., rendering surfaces hydrophobic or hydrophilic) on the microstructures and/or the substrate to guide the placement. See, for example, Gracias, et al., "Forming Electrical Networks in Three Dimensions by Self-Assembly," *Science*, Vol. 289, Aug. 18, 2000, pp. 1170–1172. Other procedures employ long-range forces, such as electro-static attraction, for placement. Generally, these procedures require water as the transport medium and cannot tolerate air/water interfaces (i.e., no bubbles). These interfaces are extremely high-energy surfaces that strongly attract microstructures, which leads to clumping or trapping of the coated microstructures. This behavior decreases the efficiency of the location process.

Another procedure for assembling microstructures on a substrate involves applying the microstructures in a fluid medium through the use of a pipette. See, for example, Srinivasan, et al., "Microstructure to Substrate Self-Assembly Using Capillary Forces," *J. Microelectromech. Syst.*, vol. 10, pp. 17–24, March 2001. Those skilled in the art will understand that this procedure does not lend itself to a manufacturing environment in which large numbers of microstructures are to be assembled on multiple substrate wafers.

Therefore, there exists a need in the art for a method and apparatus that facilitates the transport and dispersal of microstructures onto a substrate for fluidic self-assembly. There exists a further need for a method and apparatus that allows for the microstructures to be repeatedly and at least somewhat uniformly dispersed over a substrate wafer. There exists a further need for a method and apparatus that eliminates or, at least, minimizes air/fluid interfaces to avoid the attractive forces between such interfaces and small-sized microstructures. Finally, there exists a need for a method and apparatus for fluidic assembly that may support the assembly of large numbers of microstructures on multiple substrates in a manufacturing environment.

SUMMARY

Embodiments of the present invention provide a method and apparatus for self-assembly of electronic micro-systems on a wafer-scale level. These embodiments provide for the transportation, dispersal, and positioning of individual device and integrated circuit microstructure components into host circuits for fabricating mixed-technology systems or to populate assembly templates for subsequent wafer-scale component printing. The embodiments provide an environment to efficiently transport device microstructures within a liquid medium and to position the microstructures in or on host substrates.

Embodiments of the present invention do not require the flow of the liquid medium or internally moving parts or external pumps to circulate the microstructures over the surface of a host substrate. Instead, gravity is used to mechanically manipulate the microstructures through a set of ramps that are generally disposed circumferentially inside an assembly vessel. The host substrate is disposed within the center of the assembly vessel. By disposing the assembly vessel at an incline and rotating the inclined vessel, the ramps act to gradually move the microstructures upward, collecting the unincorporated microstructures from the bottom portion of the vessel and releasing them over the top of substrate.

Preferably, low friction, low energy surface coatings are used on the interior surfaces of the assembly vessel. Further, the use of low frequency vibration of the assembly vessel is also preferred to facilitate the sliding of the microstructures across the substrate and to help prevent adhesion of the microstructures to the walls of the vessel. The vessel may be filled entirely with a fluid to exclude air from within the assembly vessel.

According to embodiments of the present invention, the unincorporated microstructures may be continuously passed over the surface of the substrate until all of the positions on the substrate to be filled are filled or until a desired yield is reached. Changing the rotation speed of the assembly template assists in controlling the flow rates and patterns of the microstructures over the substrate surface. Hence, a uniform or near uniform distribution of the microstructures across the substrate surface may be achieved.

Embodiments of the present invention may be used with a variety of liquids, such as water, methanol, etc., to assemble microstructures using both gravity- and chemical coating-based self assembly processes.

DETAILED DESCRIPTION

Figure 1:
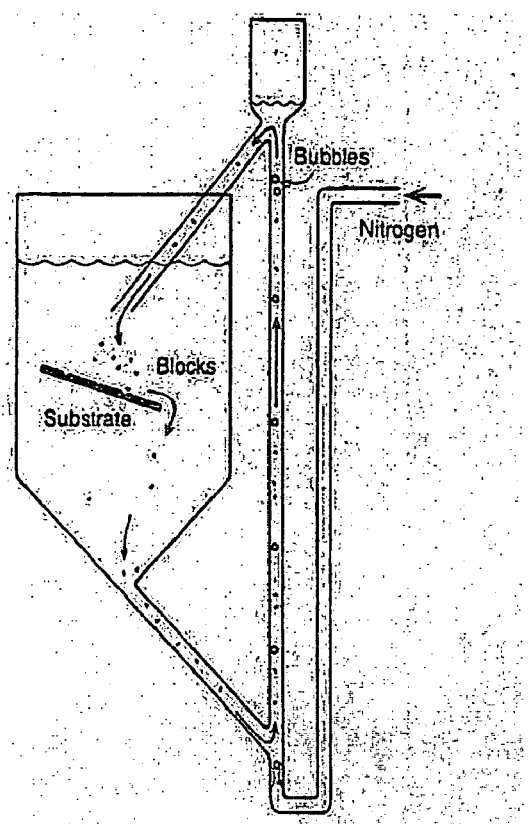
FIG. 1 (prior art) is an illustration of an apparatus for assembling microstructures onto a substrate using processes known in the art.

The present invention will now be described more fully hereinafter with reference to the accompanying drawings, in which preferred embodiments of the invention are shown. This invention may be embodied in many different forms and should not be construed as limited to the embodiments set forth herein. Further, the dimensions of layers and other elements shown in the accompanying drawings may be exaggerated to more clearly show details. The present invention should not be construed as being limited to the dimensional relations shown in the drawings, nor should the individual elements shown in the drawings be construed to be limited to the dimensions shown.

As used herein, "microstructures" are used interchangeably with "components," "pixels," "integrated circuit components," "electronic devices," or "semiconductor structures" and generally refer to devices fabricated by semiconductor techniques that are to be assembled on a separate host structure. Further, as used herein, "receptacle" is used interchangeably with "receptacle site" and generally refers to a region on a host substrate at which a microstructure is to be positioned.

Figure 3:
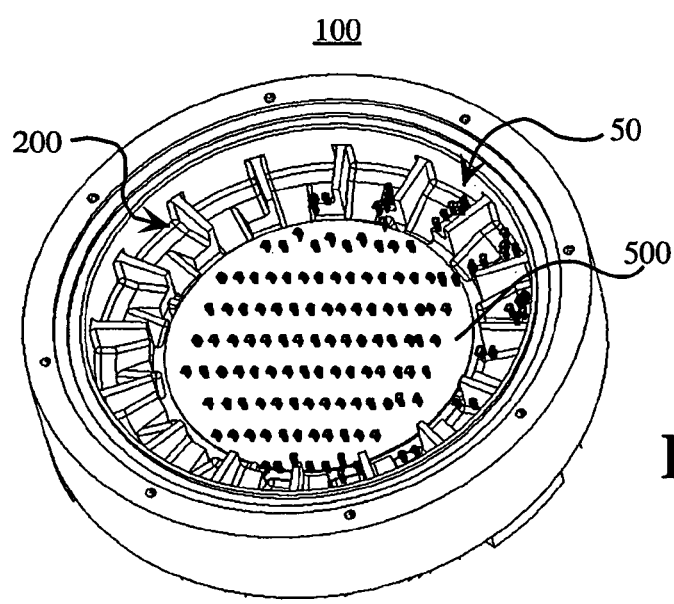
FIG. 3 shows an assembly vessel according to an embodiment of the present invention with microstructures disposed within the vessel for assembly onto a substrate.

FIG. 3 shows an embodiment of an assembly vessel 100 according to the present invention. FIG. 3 shows the use of ramp structures 200 within the assembly vessel 100 to deliver microstructures 50 to the surface of a substrate wafer 500. FIG. 3 shows that the assembly vessel 100 provides for assembly of the microstructures 50 on the substrate wafer in desired locations. FIG. 3 also shows that the use of the ramp structures 200 to capture the microstructures 50 at the bottom of the substrate wafer 500, to carry the microstructures 50 to the top of the wafer 500, and to release the microstructures back onto the surface of the wafer 500 at its top. Components of the assembly vessel 100 will be described in additional detail below.

Figure 4:
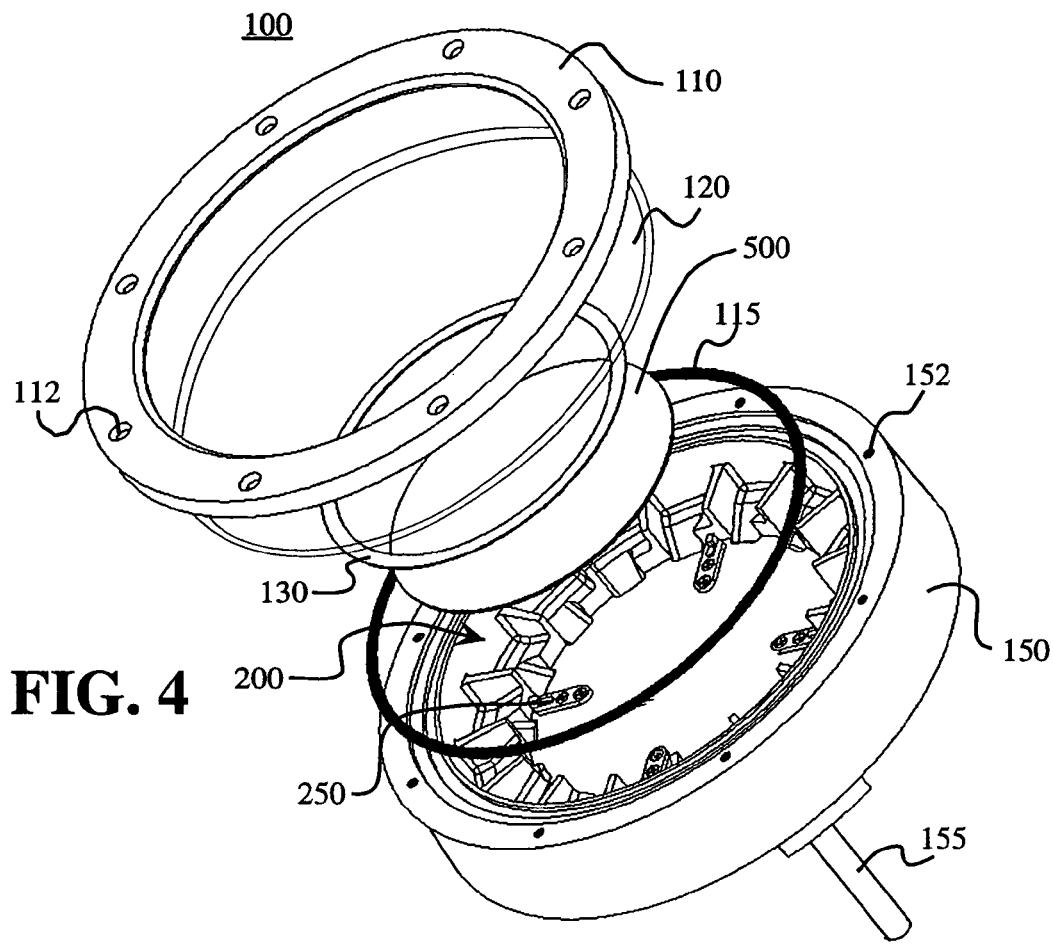
FIG. 4 is an exploded view of the assembly vessel depicted in FIG. 3 showing some components of the vessel in additional detail.

FIG. 4 presents an exploded view of the assembly vessel 100 depicted in FIG. 3. FIG. 4 shows that the assembly vessel 100 comprises a vessel body 150, a vessel cover 110, a sight glass 120, a cover seal 115, and a wafer ring 130. FIG. 4 also shows an axle 155, attached to the vessel body 150, that provides the axis around which the assembly vessel 100 may be rotated. FIG. 4 also shows a substrate wafer 500 that is positioned on the wafer supports 250 within the vessel body 150. The ramp structures 200 disposed within the vessel body 150 are described in additional detail below.

Preferred embodiments of the assembly vessel 100 comprise precision-machined metal parts. However, those skilled in the art will understand that other embodiments of the assembly vessel may be manufactured from molded metal, plastic, or other materials. Further, the embodiments depicted and described within the present disclosure generally present embodiments configured to handle 3 inch wafers. Those skilled in the art will understand that other embodiments may be scaled up or down to handle larger or smaller-sized wafers.

The assembly vessel 100 is made ready for the self-assembly process by first placing the substrate wafer 500 to be populated with the microstructures 50 on the wafer supports 250. The substrate ring 130 is then disposed around and above the edge of the substrate wafer 500. A liquid to facilitate the self-assembly process is then poured into the assembly vessel 100. The microstructures 50 to be applied to the substrate wafer 500 may be already contained within the liquid or separately placed in the assembly vessel 100. The cover 110, sight glass 120, and cover seal 115 are then placed on the vessel body 150 and fastened so as to seal the assembly vessel 100. The cover seal 115 assists in seating the sight glass 120 and the vessel cover 110 on the vessel body 150. The cover seal 115 also assists in making sure that all air is forced out of the assembly vessel 100 when the vessel 100 is sealed.

FIG. 4 shows screw openings 112 in the cover 110 and screw holes 152 in the vessel body 150 to allow the cover 110 to be fastened to the vessel body 150. However, other means for fastening the cover 110 to the body 150 may be used. As briefly indicated above, it is preferred that a tight seal between the cover 110 and the body 150 be achieved to allow air to be forced from liquid contained within the assembly vessel 100 and to prevent leaks of the liquid. Of course, the vessel body 150 and other components of the assembly vessel 100 are also preferably manufactured to achieve the desired tight seal.

The sight glass 120 shown in FIG. 4 allows the assembly process to be viewed while the assembly vessel is being rotated (described in additional detail below). However, to simplify the fabrication of the assembly vessel 100, the sight glass 120 may be eliminated and the cover 110 fabricated as a single piece to cover and seal the assembly vessel 100.

Figure 5:
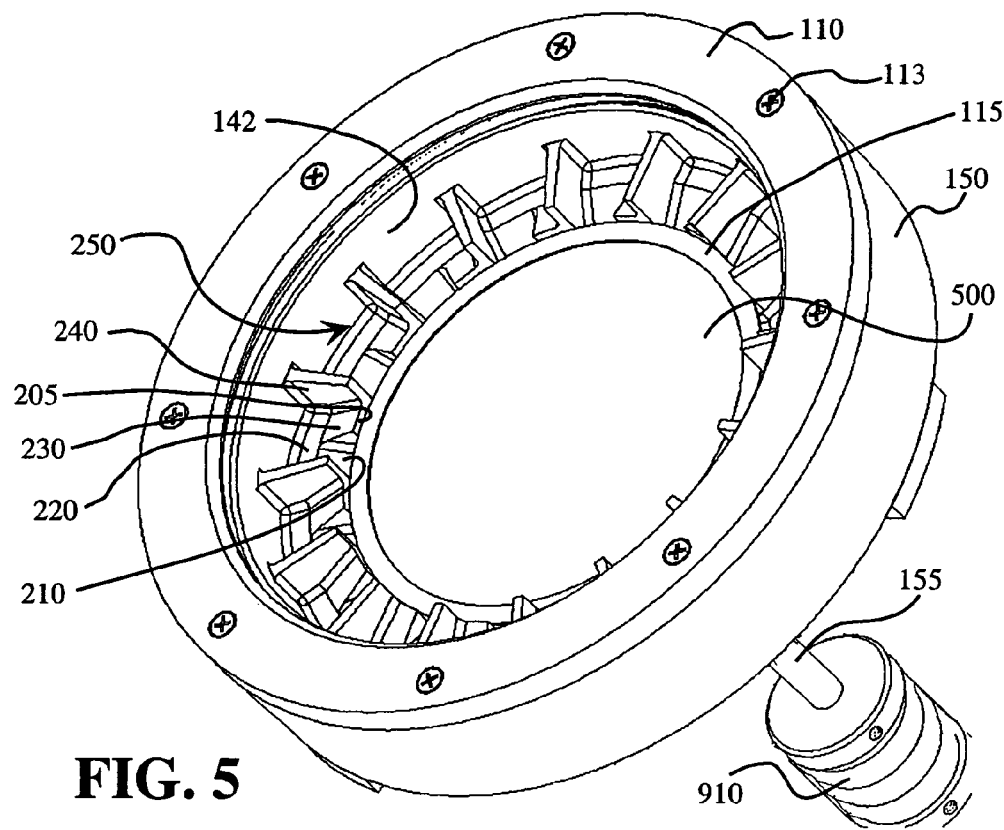
FIG. 5 shows a closer view of the assembly vessel depicted in FIG. 3.
Figure 6:
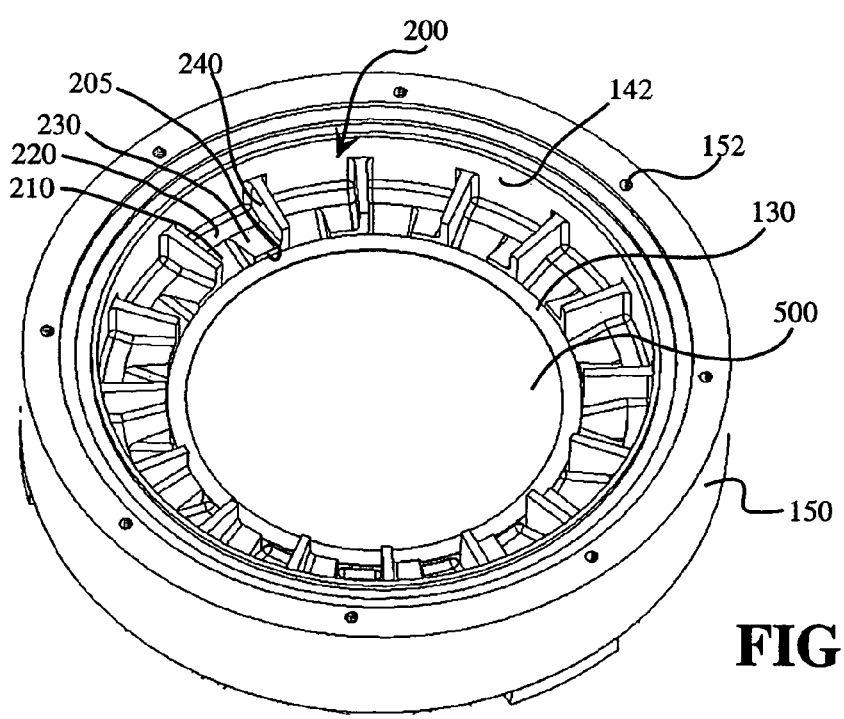
FIG. 6 shows the assembly vessel depicted in FIG. 5 with the cover and sight glass removed.

FIG. 5 provides a close-up view of the assembly vessel 100 when sealed for the assembly process. FIG. 6 shows the assembly vessel with the cover 110, sight glass 120, and cover seal 112 removed. FIG. 5 shows the use of screws 113 to fasten the cover 110 to the vessel body 130. FIGS. 5 and 6 illustrate the ramp structures 200 used to transport microstructures around the substrate wafer 500 and deliver the microstructures 50 to the wafer 500 during the assembly process.

Preferably, the ramp structures 200 are disposed in a continuous fashion around the inner wall 142 of the vessel body 150, as shown in FIGS. 5 and 6. Each ramp structure 200 comprises a receiving ramp portion 210, a ramp transition portion 220, a delivery ramp portion 230, and a ramp wall 240. The outer wall of each ramp portion 200 is defined by the inner wall 142 of the vessel body 150. FIGS. 5 and 6 also show a portion of the inner wall 205 of each ramp portion 200. These portions will be described in additional detail below.

FIG. 5 also shows the vessel axle 155 and vessel rotator 910. The vessel rotator 910 provides that the assembly vessel 100 may be continuously rotated at a selected speed. As will be described in additional detail below, the rotation of the vessel 100 provides that the microstructures 50 may be applied across the surface of the substrate wafer 500.

Figure 7:
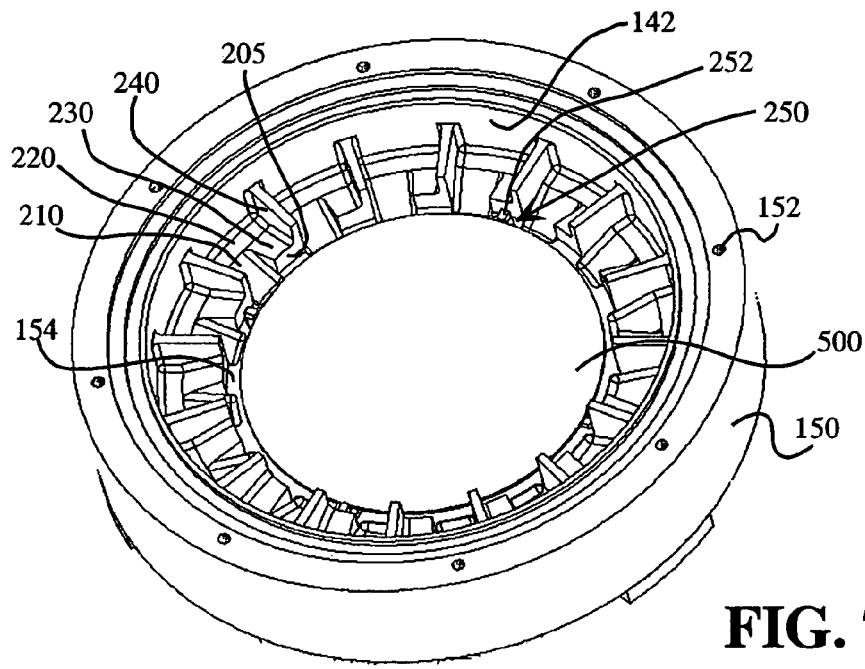
FIG. 7 show the assembly vessel depicted in FIG. 6 with the substrate ring removed.

FIG. 7 shows the assembly vessel 100 with the substrate ring 130 removed. FIG. 7 also shows the complete inner wall 205 of each ramp portion 200, which is defined by a wall that projects from the top of the delivery ramp portion 230 to the floor 154 of the vessel body 150. Preferably, when installed, the outer edge of the substrate ring 130 rests against or nearly against the inner wall 205 of each ramp portion 200. The substrate ring 130 preferably has a thickness that is greater than the horizontal gap between the ramp portion inner wall 205 and the outer edge of the substrate wafer 500. The substrate ring 130 rests on the wafer supports 250. The wafer supports 250 have a ring support portion 252 that holds the substrate ring 130 above the surface of the substrate wafer 500 such that there is a vertical gap between the bottom of the substrate ring 130 and the top of the substrate wafer 500.

Figure 8:
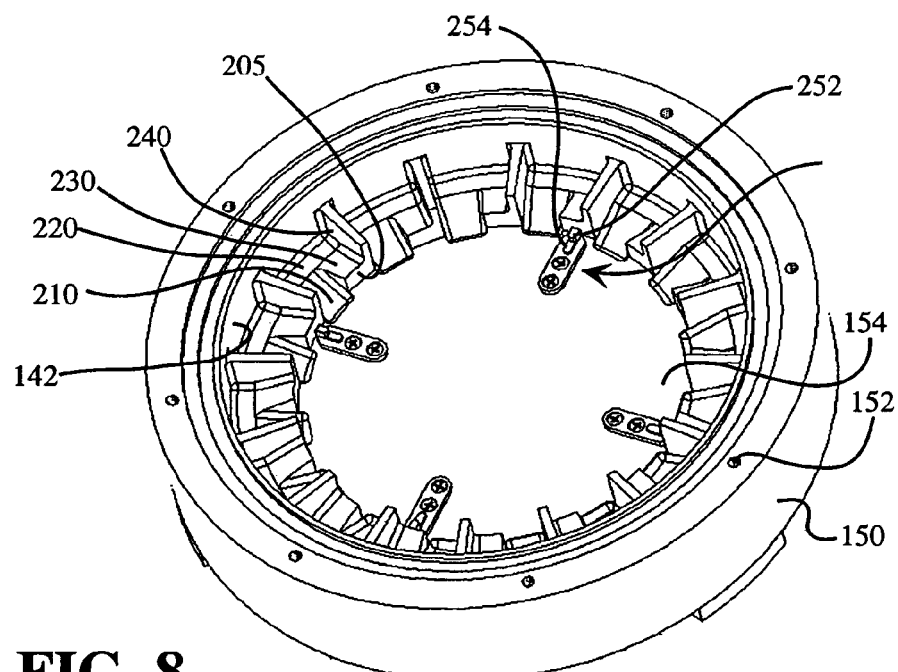
FIG. 8 shows the assembly vessel depicted in FIG. 7 with the assembly substrate removed.

FIG. 8 shows the assembly vessel 100 without the substrate wafer 500 and substrate ring 130. Particularly, FIG. 8 shows the wafer supports 250 disposed on the floor 154 of the vessel body 150 that are used to hold the substrate wafer 500. The wafer supports 250 comprise the ring support portion 252 that holds the substrate ring 130, as described above, and a lower support portion 254 that holds the substrate wafer 500. Preferably, the lower support portion 254 holds the substrate wafer 500 above the floor 154 of the vessel body 150 so that there is a vertical gap between the floor 154 and the bottom of a substrate wafer 500. Preferably, this vertical gap is sized so as to allow the microstructures 50 to be positioned on the substrate wafer 500 to move beneath the wafer 500. FIG. 8 shows four wafer supports 250, but those skilled in the art will understand that the wafer supports 250 may number more than or less than four. Those skilled in the art will also understand that other embodiments of the present invention may use different wafer supports than those depicted in FIG. 8 or that no wafer supports may be used.

Figure 9A:
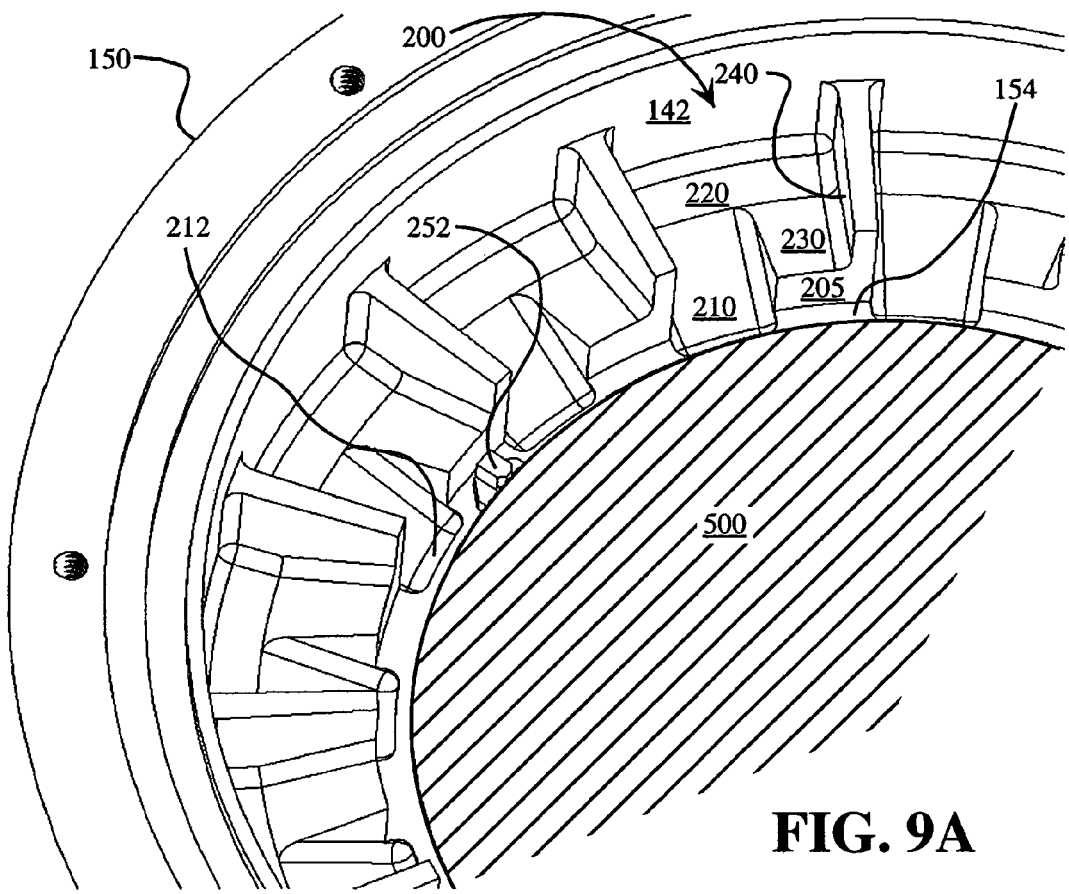
FIG. 9A shows a close-up view of a portion of the assembly vessel depicted in FIG. 7.

FIG. 9A shows a close up view of several of the ramp structures 200 according to an embodiment of the present invention. FIG. 9A shows a portion of a substrate wafer 500 positioned on a wafer support 250 with no substrate ring 130. As previously described, each ramp structure 200 comprises a receiving ramp portion 210, a ramp transition portion 220, a delivery ramp portion 230, and a ramp wall 240. The ramp structure 200 provides a continuous path from at or below the floor 154 of the vessel body 150 to a position above the wafer ring 130.

As can be seen in FIG. 9A, the receiving ramp portion 210 projects upwards from the floor 154 of the vessel body 150 towards the inner wall 142 of the vessel body. The receiving ramp portion 210 may additionally comprise a recess 212 at the base of the receiving ramp portion 210. The recess 212 projects beneath the floor 154 of the vessel body 150 to facilitate the capture of the microstructures 50 falling from the surface of the substrate wafer 500 or moving along the surface of the floor 154 of the vessel body 150.

The delivery ramp portion 230 projects from the inner wall 142 of the vessel body 150 to a position at and above the edge of the wafer ring 130. The ramp transition portion 220 provides a smooth transition from the receiving ramp portion 210 to the delivery ramp portion 230 at the inner wall 142 of the vessel body 150. The ramp wall 240 provides that the microstructures will properly traverse the ramp structure 200 as the assembly vessel 100 rotates.

Figure 9B:
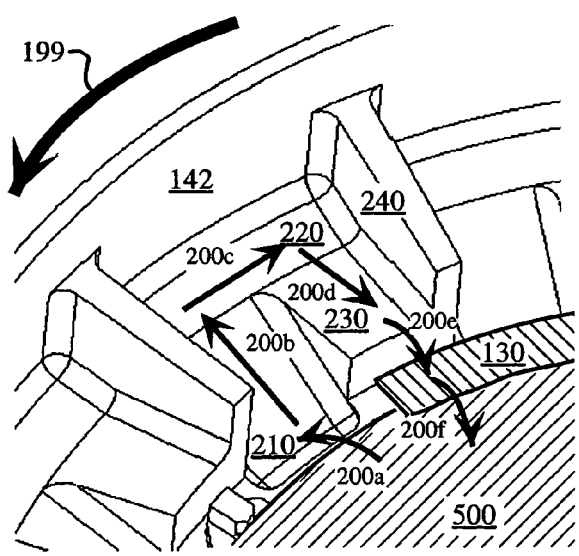
FIG. 9B shows a further close-up view of a portion of the assembly vessel depicted in FIG. 9A illustrating the path that a microstructure takes during the assembly process.

FIG. 9B shows the paths that a microstructure 50 will follow as the assembly vessel 100 rotates in a counterclockwise manner (shown by line 199). Those skilled in the art will understand that the ramp structure 200 shown in FIG. 9B should be constructed with the receiving ramp and delivery ramp portions 210, 230 swapped if the assembly vessel 100 is rotated in a clockwise manner. As noted above, the assembly vessel 100 is generally oriented at an angle so that as the assembly vessel 100 rotates, each ramp structure 200 will, at one point in time, be located below the substrate wafer 500 and, at another point in time, will be located above the substrate wafer 500.

As shown in FIG. 9B, curve 200a shows the path that the microstructure 50 will take from the surface of the substrate wafer 500 to the receiving ramp portion 210 when the ramp structure 200 is rotated so that the ramp structure 200 is located below the substrate wafer 500. At this point, the angle of orientation of the assembly vessel 100 is preferably such that the microstructure will continue to move in the direction of line 200b towards the inner wall 142 of the vessel body 150. As the assembly vessel 100 rotates, the microstructure 50 will move towards the ramp wall 240 as shown by line 200c. As the ramp structure 200 is rotated to be above the substrate wafer 500, the microstructure 50 will move in the direction indicated by line 200d. When the microstructure 50 leaves the top of the delivery ramp portion 230, it will first fall onto the wafer ring 130 as shown by curve 200e in FIG. 9B. The microstructure 50 will then fall from the wafer ring 130 onto the substrate wafer 500 as shown by curve 200f. Gravity will then cause the microstructure 50 to move across the surface of the substrate wafer 500, where the microstructure 50 may be captured and located at a specific position on the wafer 500, or fall to the bottom of the assembly vessel 100, where the microstructure 50 will be captured by one of the ramp structures 200 for transport back to above the substrate wafer 500.

Figure 10:
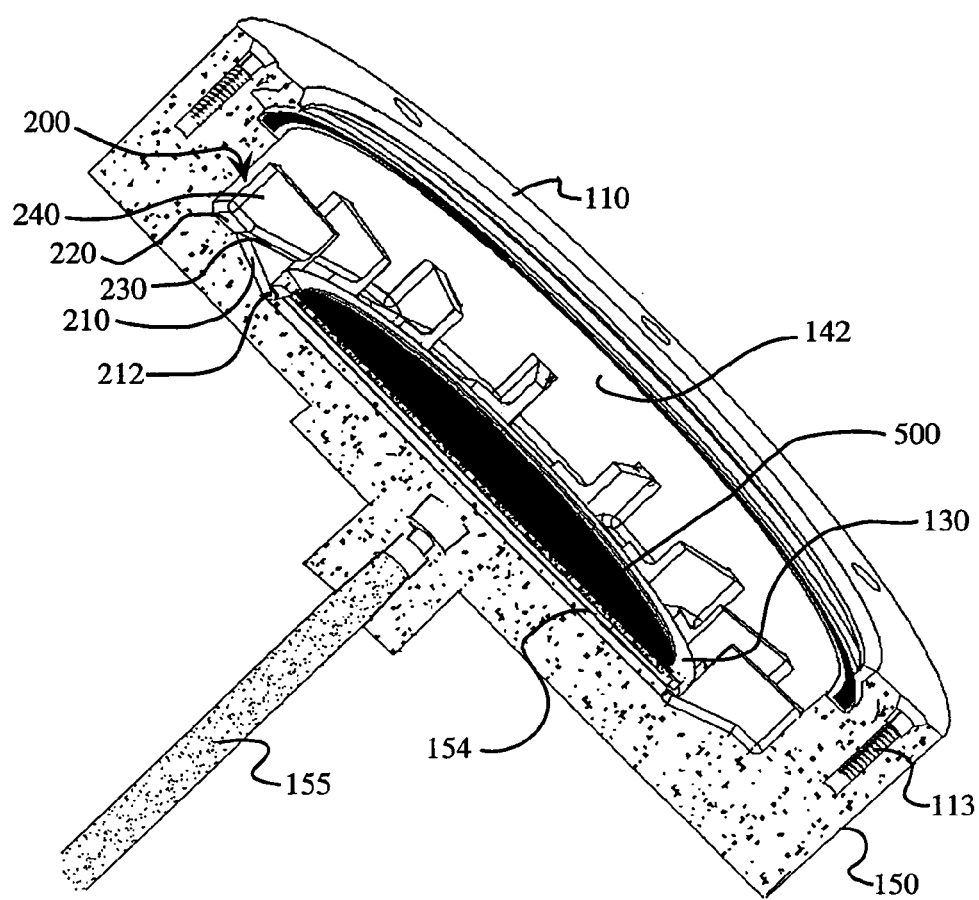
FIG. 10 shows a cross-section view of the assembly vessel depicted in FIG. 5.

To further illustrate the embodiment of the invention depicted in FIG. 5, FIG. 10 presents a cross-sectional view of that embodiment. FIG. 10 shows the preferable disposition of the cover seal 115 being beneath the cover 110 and sight glass 120. FIG. 10 also shows that the receiving ramp portion 210 of the ramp structure 200 preferably projects slightly below the floor 154 of the vessel body 150. The delivery ramp portion 230 ends at a height above the wafer ring 130 and the substrate wafer 500. FIG. 10 also shows the preferred gap between the wafer ring 130 and the substrate wafer 500 and the gap between the substrate wafer 500 and the floor 154 of the vessel body 150.

Preferably, all surfaces within the assembly vessel 100 which may be contacted by the microstructures 50 during the assembly process are coated with or comprise low friction, low energy surface coatings to facilitate the sliding of the microstructures 50 within the assembly vessel 100 and to prevent adhesion of the microstructures 50 to the surfaces within the assembly vessel 100. For example, surface coatings of SU-8 epoxy may be used on all internal surfaces of the assembly vessel 100. SU-8 epoxy is a low friction coating that should prevent unwanted adhesion, should facilitate sliding of the microstructures, and provide a soft material that will reduce the possibility of damage to the microstructures 50 while they are being moved within the assembly vessel 100.

The assembly vessel 100 is also preferably filled with a fluid and sealed so as to force all air out of the assembly vessel 100. Preferably, the fluid includes a surfactant, such as polyoxyethylene (2) sorbitan monolaurate, which is commercially available under the tradename Tween® 20.

Figure 14A:
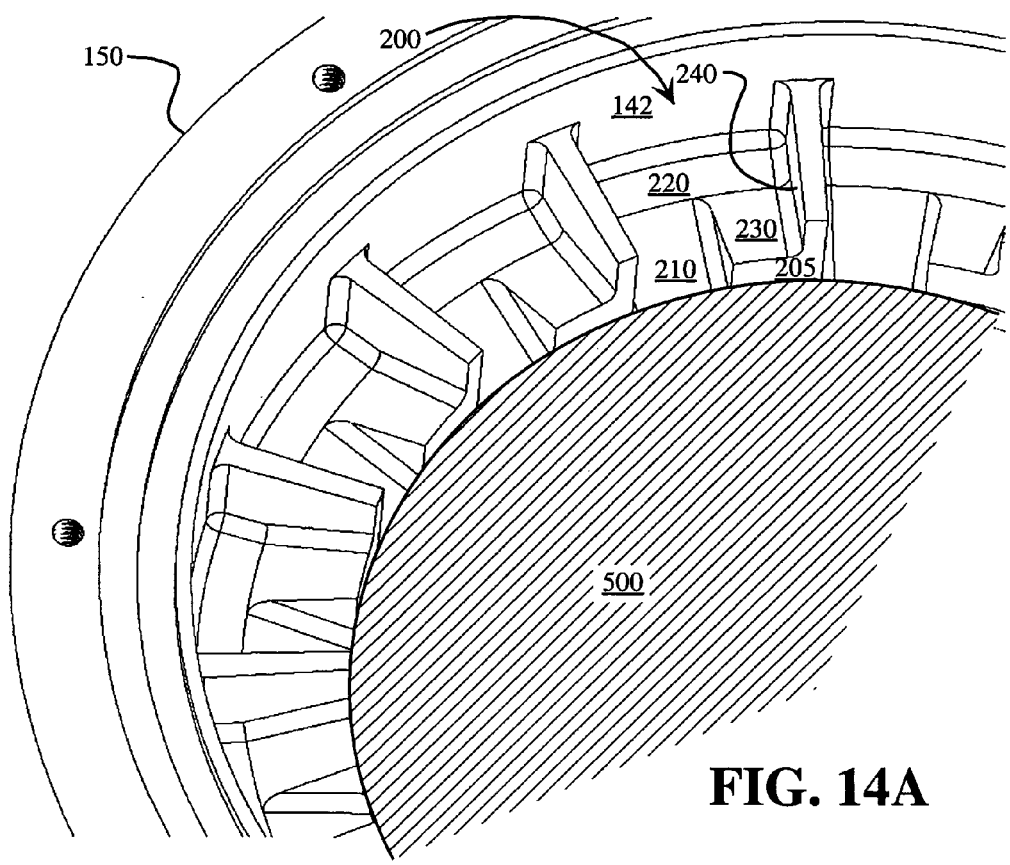
FIG. 14A shows a close-up view of an alternative embodiment of the present invention in which no substrate ring is used to transition between the ramp structures and the substrate wafer.

The apparatus 100 described above and shown in FIGS. 3–10 uses the substrate ring 130 to provide a transition between each delivery ramp portion 230 and the surface of the substrate wafer 500. However, alternative embodiments of an apparatus according to the present invention may eliminate the use of this substrate ring. FIG. 14A shows a portion of the assembly vessel 100 according to the present invention in which no substrate ring 130 is used.

In FIG. 14A, the outer edge of the substrate wafer 500 is disposed adjacent to the inner wall 205 of each ramp portion 200. Preferably, the spacing between the outer edge of the substrate wafer 500 and each inner wall 205 is less than the sizes of the microstructures to be positioned on the substrate wafer 500. Those skilled in the art will understand that such a close spacing may require precise fabrication or machining of the apparatus 100 and precise fabrication of the substrate wafer 500, but such precise fabrication and/or machining techniques are well known in the art.

Not shown in FIG. 14A are the wafer supports 250 and the recesses 212 that may be disposed at the bottom of each receiving ramp portion 210. The wafer support elements 250 may be similar to those as earlier described, but sized so that the substrate wafer 500 is elevated more in relation to the floor 154 of the vessel body. The recesses 212 may be used to further facilitate the capture of the microstructures 50 as they slide off the substrate wafer 500.

Figure 14B:
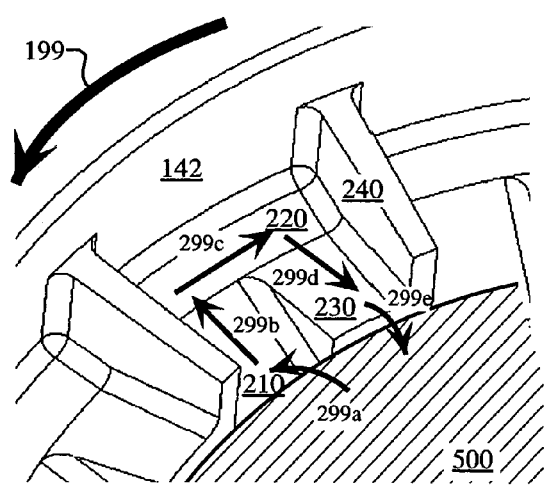
FIG. 14B shows a further close-up view of the portion of the assembly vessel depicted in FIG. 14A illustrating the path that a microstructure takes during the assembly process in this embodiment.

FIG. 14B depicts the path that a microstructure may take when the assembly vessel 100 shown in FIG. 14A is rotated. Curve 299a shows the path that a microstructure 50 will take from the surface of the substrate wafer 500 to the receiving ramp portion 210 when the ramp structure 200 is rotated so that the ramp structure 200 is located below the substrate wafer 500. At this point, the angle of orientation of the assembly vessel 100 is preferably such that the microstructure 50 will continue to move in the direction of line 299b towards the inner wall 142 of the vessel body 150. As the assembly vessel 100 rotates, the microstructure 50 will move towards the ramp wall 240 as shown by line 299c. As the ramp structure 200 is rotated to be above the substrate wafer 500, the microstructure 50 will move in the direction indicted by line 299d. When the microstructure 50 leaves the top of the delivery ramp portion 230, it will fall onto the substrate wafer 500 as shown by curve 299e. Gravity will then cause the microstructure 50 to move across the surface of the substrate wafer 500, where the microstructure 50 may be captured and located at a specific position on the wafer 500, or fall to the bottom of the assembly vessel 100, where the microstructure 50 will be captured by one of the ramp structures 200 for transport back to above the substrate wafer 500.

Figure 15:
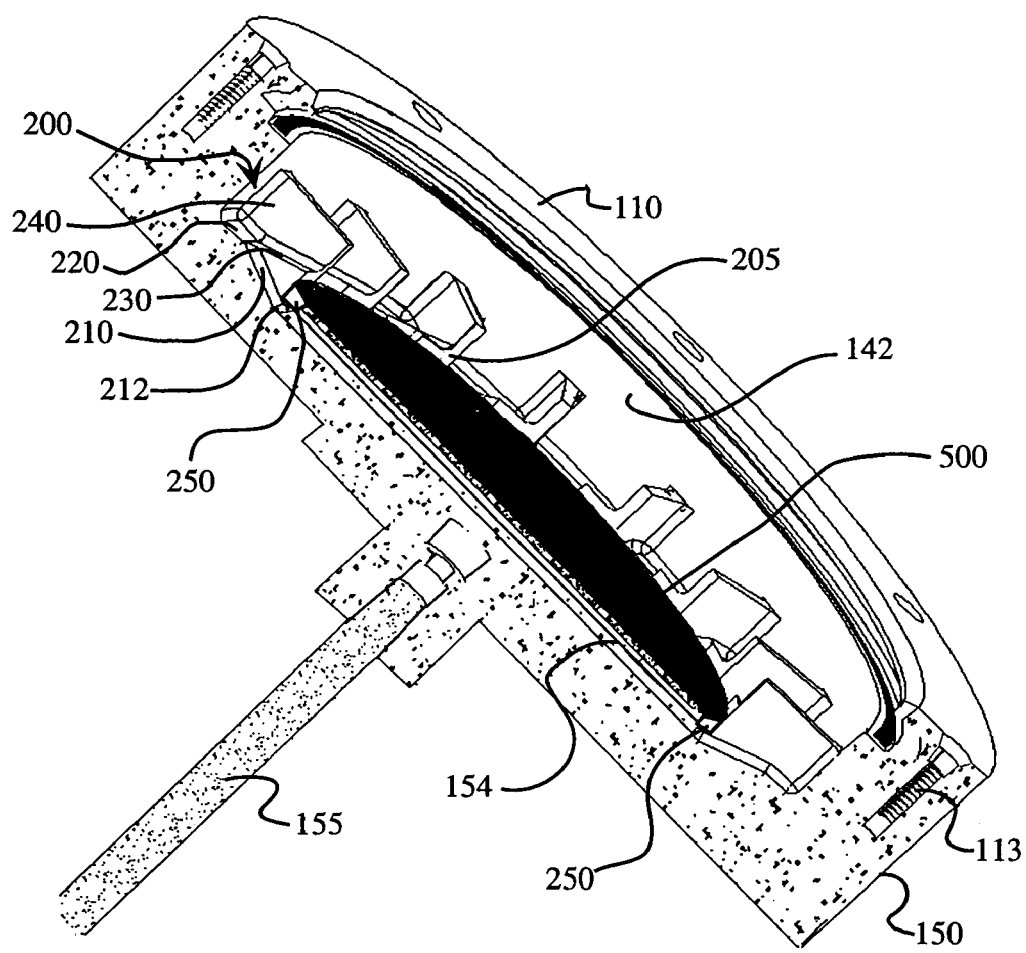
FIG. 15 shows a cross-section of the assembly vessel depicted in FIGS. 14A and 14B.

To further illustrate the embodiment depicted in FIGS. 14A and 14B and its difference from the earlier described embodiment, FIG. 15 presents a cross-sectional view of the embodiment shown in FIGS. 14A and 14B. As can be seen from FIG. 15, there is no substrate ring 130 and the outer edge of the substrate wafer 500 is adjacent to the inner wall 205 of each ramp portion 200. FIG. 15 also shows the wafer supports 250 that are disposed on the floor 154 of the vessel body 150 to elevate the substrate wafer 500 from the floor 154.

Figure 11:
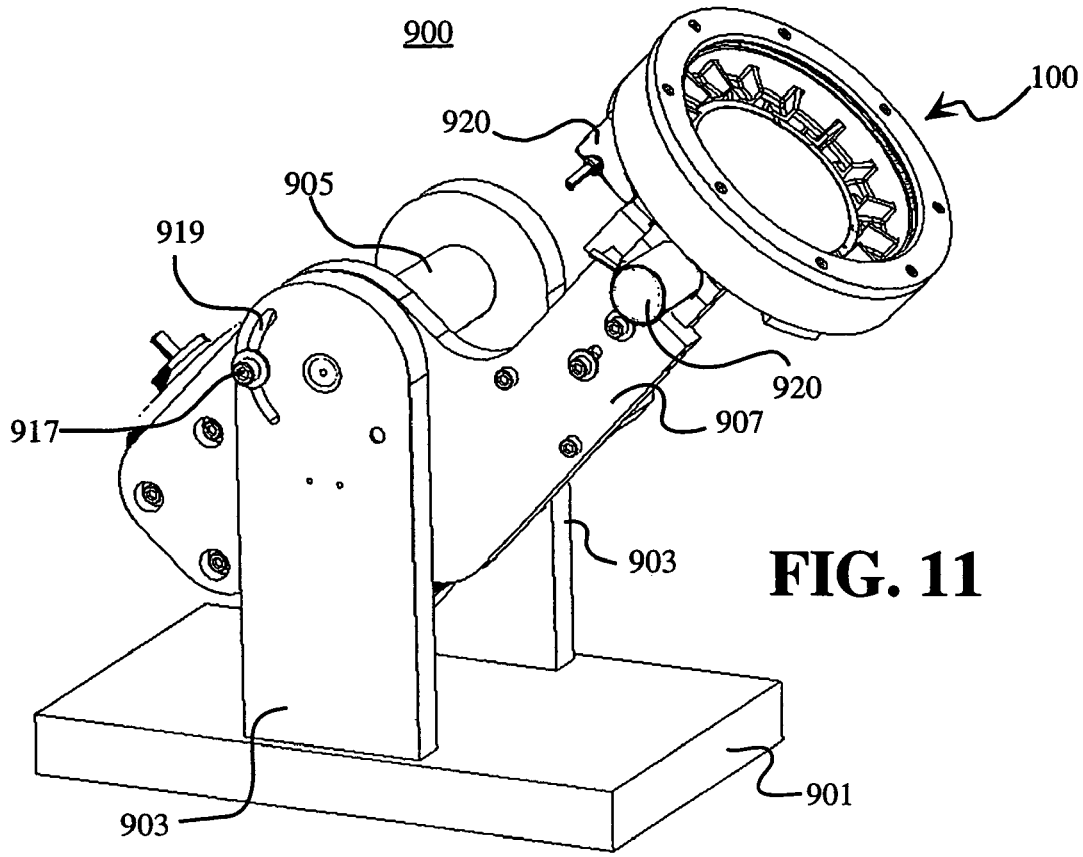
FIG. 11 shows a perspective view of an assembly structure holding an embodiment of the assembly vessel according to the present invention.

The assembly vessel 100 is preferably disposed at an angle to the horizontal plane, so that gravity facilitates the movement of the microstructures 50 across the substrate wafer 500 as the assembly vessel 100 rotates. FIG. 11 shows an assembly structure 900 adapted to dispose the assembly vessel 100 at a desired tilt angle. As discussed in more detail below, the assembly structure 900 may also have components that provide for both the rotation of the assembly vessel 100 and vibration of the vessel 100.

FIG. 11 shows the assembly structure 900 comprising a base 901, two vertical supports 903 projecting from the base 901, a pivot axle 905, and a vessel bracket 907. The pivot axle 905 supports the vessel bracket 907 from the vertical supports 903. The bracket 907 pivots around the pivot axle 905, which allows the assembly vessel 100 disposed at the end of the bracket 907 to be disposed at a wide range of tilt angles. A bolt 917 positioned through a slot 919 in one of the vertical supports 903 allows the vessel bracket 907 to be fixed at a desired pivot angle. Those skilled in the art will understand that other means may be used to position and hold the bracket 907 at a desired pivot angle. FIG. 11 also shows the vessel vibrators 920, which are discussed in additional detail below.

Figure 12:
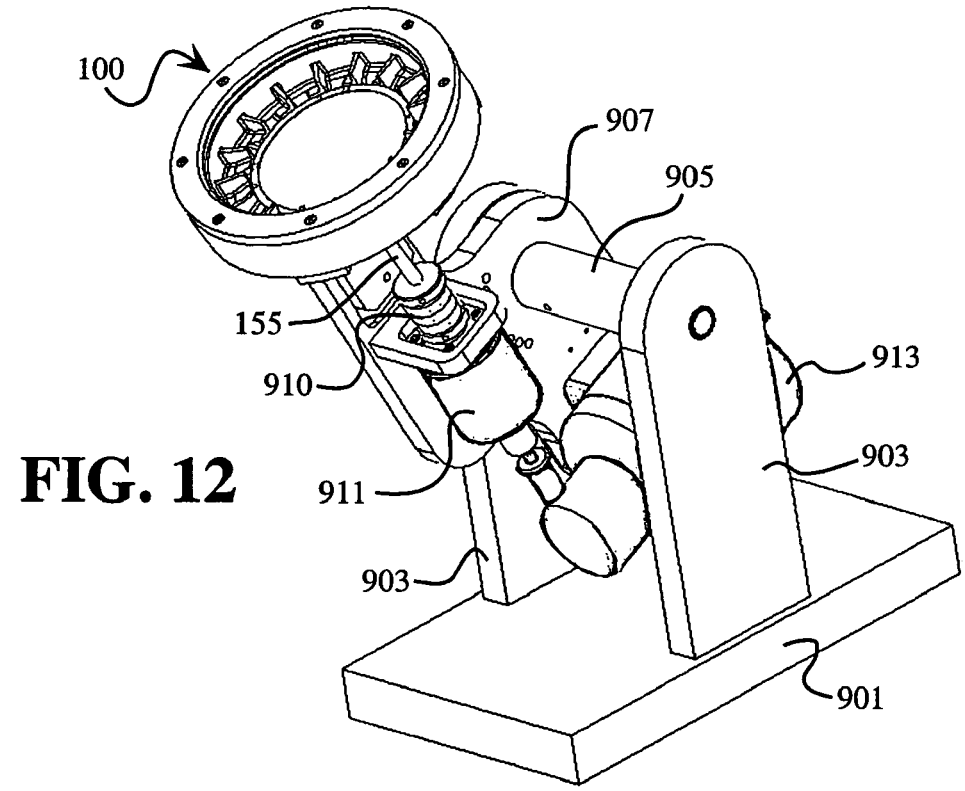
FIG. 12 shows another perspective view of the structure shown in FIG. 11.

FIG. 12 shows the assembly structure 900 from the opposite side to highlight the components used to rotate the assembly vessel 100. A motor 913 is coupled to a rotation mechanism 911, which is coupled to the vessel rotator 910. The motor 913 provides the power to rotate the vessel rotator 910 at a desired rotational rate. As shown in FIG. 12, the vessel rotator 910 is coupled to the vessel axle 155, which rotates the assembly vessel 100. Those skilled in the art will understand that other components or mechanisms may be used to rotate the assembly vessel 100. Preferably, the assembly structure 900 is operated to complete a rotation about once per minute, but other rotational speeds may be used.

Figure 13:
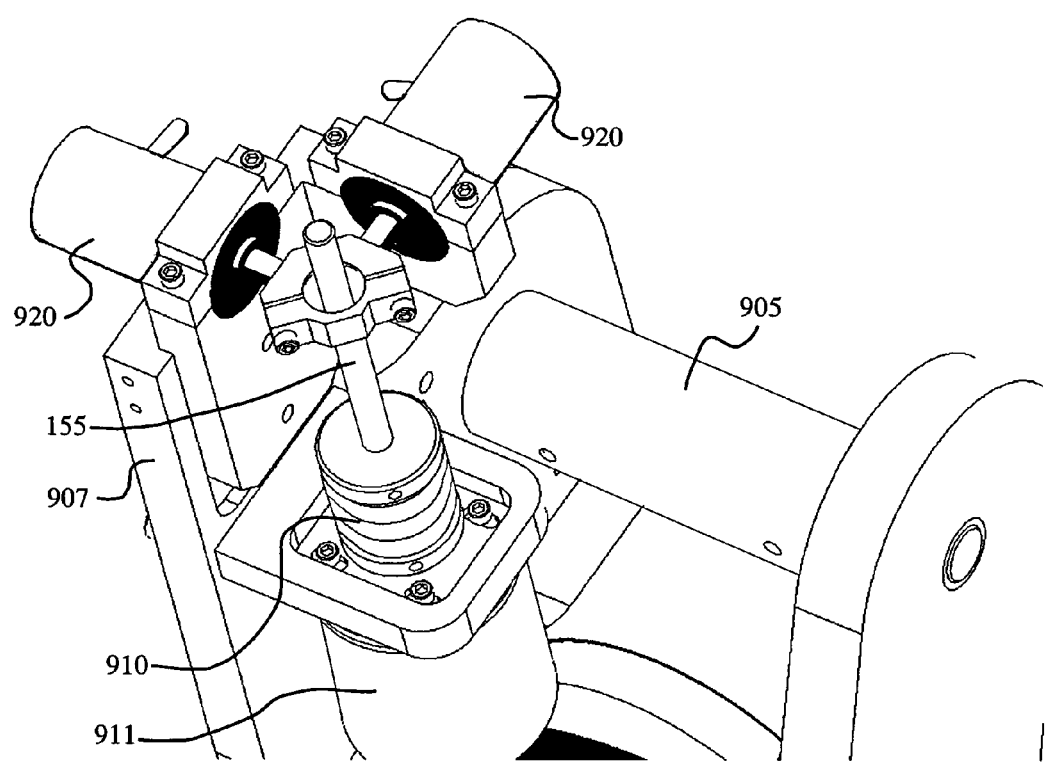
FIG. 13 shows a close-up view of the rotation and vibration components (with the assembly vessel removed) of the assembly structure depicted in FIGS. 11 and 12.

FIG. 13 shows a close-up view of the vessel rotator 910 and the vessel vibrators 920 (with the assembly vessel removed) of the assembly structure 900 depicted in FIGS. 11 and 12. Preferably, two vessel vibrators 920 are coupled to the vessel axle 155 to provide vibrational movement to the assembly vessel 100 in orthogonal directions. The use of small amplitude mechanical vibration facilitates the capture and assembly of the microstructures 50 into receptacle sites on the substrate wafer 500. Preferable frequencies for the vibration range from 200 Hz to 600 Hz, but other frequencies may be used. The vibration also reduces the adherence of the microstructures 50 to the internal surfaces of the assembly vessel 100.

The assembly vessel depicted in FIG. 5 and described above was tested in the use of the assembly of silicon microstructures (55 microns×55 microns×20 microns) into a 30×30 array of complementary-shaped receptacle sites on a substrate wafer. The receptacle sites were micro-molded into the surface of an SU-8 coated silicon wafer. The receptacle wafer was placed into the assembly vessel along with approximately 100 microstructures in an ethanol solution containing Tween® 20 surfactant. The assembly vessel was positioned at a 45 degree angle, which allowed the microstructures not captured within the receptacle sites to easily slide off the wafer. The entire assembly vessel was also mechanically vibrated at 400 Hz.

Figure 2:
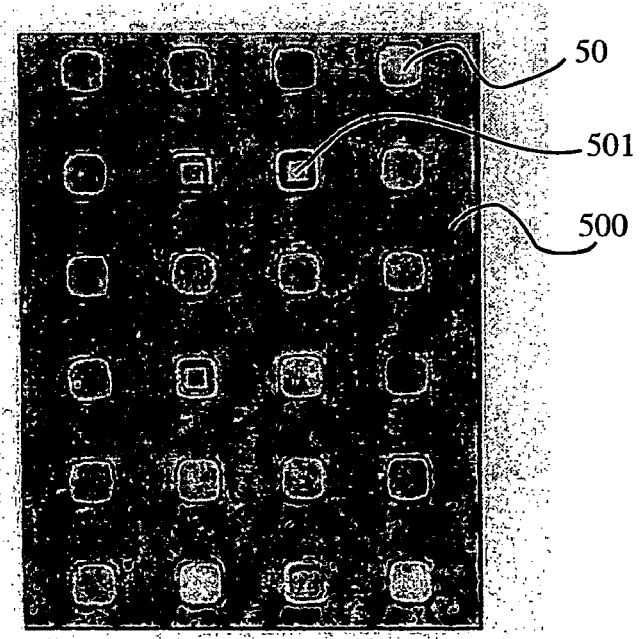
FIG. 2 is a photograph of a substrate with a molded receptacle layer containing several microstructures.

In typical test runs, yields of approximately 95% for populating the arrays with the microstructures were achieved after about 5 minutes of circulating the microstructures over the receptacle array by rotating the assembly vessel. FIG. 2 shows an example of an array filled by using the apparatus and method described above. Specifically, FIG. 2 shows microstructures 50 positioned on the substrate wafer 500 and also shows receptacles 501 in which no microstructure 50 was positioned. The tests showed that the apparatus provides for efficient location and orientation of microstructures into receptacle sites on a substrate.

As the substrate wafer 500 becomes populated with microstructures 50, the assembly process may be impeded by the presence of microstructures 50 that have been positioned on the substrate. The assembly process described above results in the microstructures 50 sliding across the surface of the substrate wafer 500. If the microstructures 50, when positioned in the substrate wafer, project above the substrate wafer 500, and/or the microstructures 50 are tightly spaced on the substrate wafer 500, the sliding of the unpositioned microstructures 50 across the substrate wafer 500 may be impeded. The result may be that, even after several rotations of the assembly vessel 100, not all areas of the substrate wafer 500 may be populated with the microstructures 50. This problem may be particularly seen when several different types of microstructures 50 are to be positioned on the substrate wafer 500 in several passes. While a large percentage of the microstructures 50 may be positioned during the earlier passes, the positioning of different microstructures 50 during the later passes may again be inhibited by the presence of the earlier positioned microstructures 50.

Figure 16:
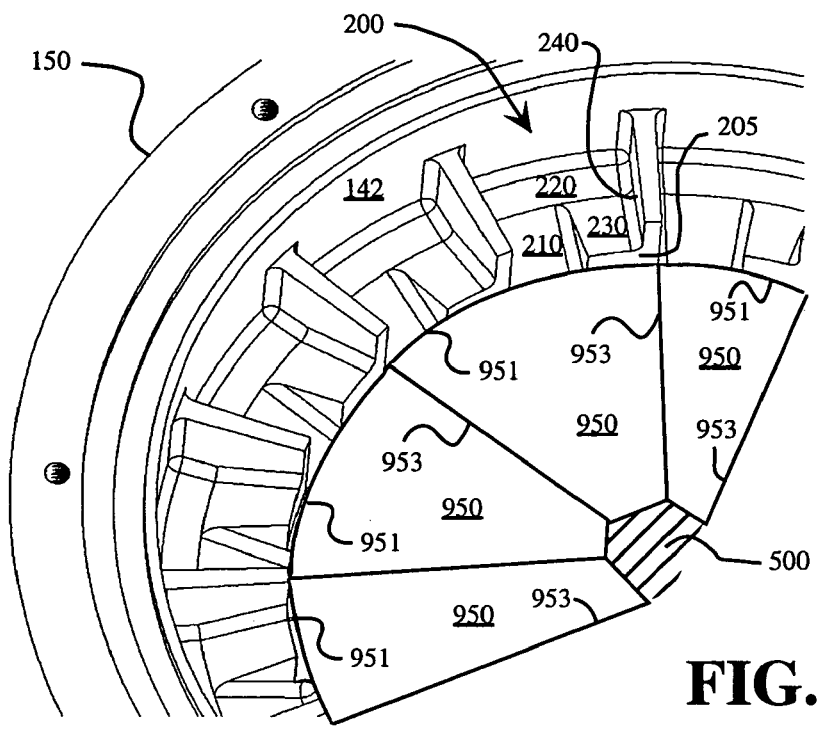
FIG. 16 shows an embodiment of an assembly vessel according to another embodiment of the present invention in which pixel guides are used.

This particular problem may be addressed by placing pixel guides on top of the substrate wafer 500 during the assembly process. FIG. 16 shows a set of pixel guides 950 placed on top of the substrate wafer 500 to direct the microstructures 50 to a particular area of the substrate wafer 500. As can be seen from FIG. 16, the pixel guides 950 may cover all of the substrate wafer 500, except the portion of the substrate wafer 500 to which the microstructures 50 are to be directed. The pixel guides 950 are shaped to as to have outer edges 951 that are preferably directly adjacent to the inner walls 205 of the ramp structures. The pixel guides 950 also preferably have raised walls 953 that serve to direct the microstructures towards the desired area of the substrate wafer 500.

Figure 17:
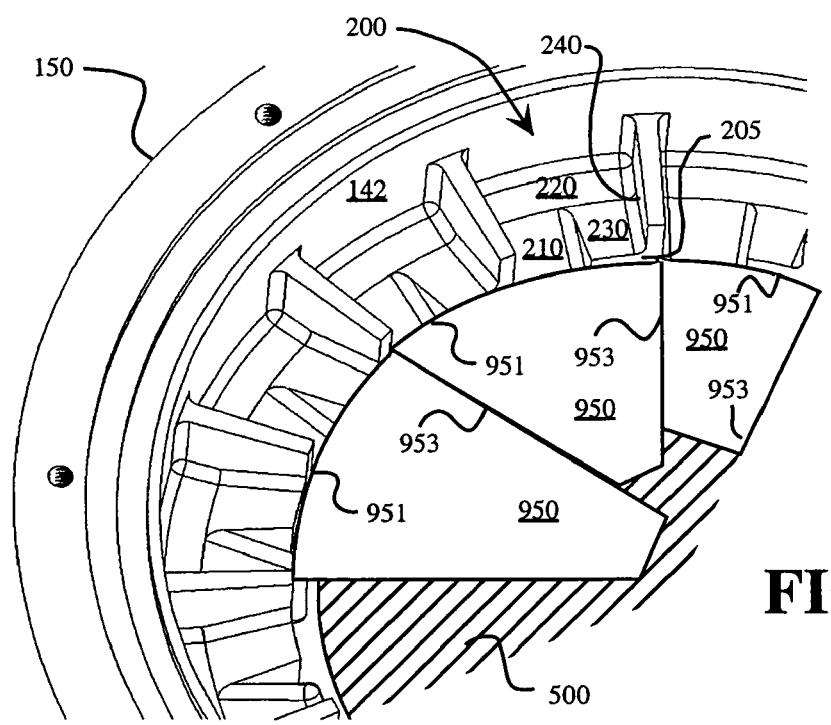
FIG. 17 shows an embodiment of an assembly vessel according to another embodiment of the present invention in which different length pixel guides are used.

Although FIG. 16 depicts the pixel guides 950 as having the same lengths, the lengths of the pixel guides 950 may be varied to provide for application of the microstructures over various portions of the substrate wafer 500. FIG. 17 shows pixel guides 950 with varying lengths. These varying lengths allow the microstructures 50 to be applied to different areas of the substrate wafer 500. This may then allow the direction of the microstructures 50 to particular inner areas of the substrate wafer 500 when the outer areas have been completely populated or nearly completely populated during earlier phases of the assembly process.

From the foregoing description, it will be apparent that the present invention has a number of advantages, some of which have been described herein, and others of which are inherent in the embodiments of the invention described herein. Also, it will be understood that modifications can be made to the method and apparatus described herein without departing from the teachings of subject matter described herein. As such, the invention is not to be limited to the described embodiments except as required by the appended claims.

What is claimed is:

1. An apparatus for assembling a microstructure on a substrate having at least one receptacle site, said apparatus comprising:
    an assembly vessel configured to receive the substrate and having one or more ramp structures disposed in the interior of the assembly vessel around the periphery of the substrate when the substrate is positioned within the interior of the assembly vessel, the substrate having an upper surface and at least one ramp structure comprising:
        a receiving ramp portion having a receiving ramp upper edge and a receiving ramp lower edge disposed at a point lower than the upper surface of the substrate; and
        a delivery ramp portion having a delivery ramp lower edge adjacent to said receiving ramp upper edge and a delivery ramp upper edge disposed at a point higher than the upper surface of the substrate.

2. The apparatus according to claim 1, wherein the at least one ramp structure has a ramp transition portion located adjacent an inner wall of the assembly vessel and the ramp transition portion couples the receiving ramp upper edge to the delivery ramp lower edge.

3. The apparatus according to claim 1, wherein the assembly vessel has a plurality of ramp structures and adjacent ramp structures are separated from each other by a ramp wall.

4. The apparatus according to claim 1, wherein the at least one ramp structure further comprises a recess disposed at the receiving ramp lower edge.

5. The apparatus according to claim 1 wherein the substrate comprises a circularly shaped substrate wafer and the interior of the assembly vessel is circularly shaped such that the ramp structures are circularly disposed around the periphery of the substrate wafer.

6. The apparatus according to claim 1, wherein the assembly vessel further comprises:
    a substrate ring having a shape similar to the periphery of the substrate and having an outer periphery larger than the periphery of the substrate;
    one or more wafer supports disposed on a floor of the assembly vessel, said wafer supports shaped to support the substrate at a first level and to support the substrate ring at a second level, wherein the substrate ring has an upper surface lower than the delivery ramp upper edge.

7. The apparatus according to claim 1, wherein the assembly vessel further comprises one or more wafer supports disposed on a floor of the assembly vessel, said wafer supports shaped to support the substrate above the floor of the assembly vessel.

8. The apparatus according to claim 1, wherein the assembly vessel further comprises:
    a cover for covering the interior of the assembly vessel; and
    a seal for providing a fluid tight seal between the cover and the interior of the assembly vessel.

9. The apparatus according to claim 1 further comprising:
    a mechanism for tilting the assembly vessel from horizontal; and
    a mechanism for rotating the assembly vessel.

10. The apparatus according to claim 9 further comprising a mechanism for applying vibrational energy to the assembly vessel.

11. The apparatus according to claim 1 further comprising one or more pixel guides disposed on top of the substrate, the one or more pixel guides extending from the periphery of the substrate to an interior area of the substrate to cover at least a portion of the substrate.

12. A method for assembling microstructures on a substrate having receptacle sites, said method comprising:
positioning the substrate within an assembly vessel;
disposing one or more of the microstructures within the assembly vessel;
tilting the assembly vessel at a selected tilt angle;
collecting microstructures not captured by the substrate at a lower edge of the substrate;
rotating the assembly vessel to carry the collected microstructures to a point above the substrate; and
releasing the collected microstructures onto a surface of the substrate.

13. The method according to claim 12 further comprising vibrating the assembly vessel.

14. The method according to claim 12, wherein one or more ramp structures collect the microstructures at the lower edge of the substrate, carry the collected microstructures to a point above the substrate, and release the collected microstructures onto the surface of the substrate.

15. The method according to claim 14, wherein at least one ramp structure of the one or more ramp structures comprises:
a receiving ramp portion having a receiving ramp upper edge and a receiving ramp lower edge disposed at a point lower than the surface of the substrate; and
a delivery ramp portion having a delivery ramp lower edge adjacent to said receiving ramp upper edge and a delivery ramp upper edge disposed at a point higher than the surface of the substrate.

16. The method according to claim 15 wherein the at least one ramp structure has a ramp transition portion located adjacent an inner wall of the assembly vessel and the ramp transition portion couples the receiving ramp upper edge to the delivery ramp lower edge.

17. The method according to claim 12 further comprising adding a fluid to the assembly vessel before tilting the assembly vessel.

18. The method according to claim 17 further comprising sealing the assembly vessel after adding the fluid.

19. The method according to claim 12 further comprising directing the microstructures to specific areas of the substrate by using pixel guides disposed on or above the surface of the substrate.

20. The method according to claim 12, wherein the substrate is positioned on substrate supports proving a gap between a bottom surface of the substrate and a floor of the assembly vessel.

21. The method according to claim 20, wherein the method additionally comprises positioning a substrate ring on a second portion of each substrate support wherein the second portion of each substrate support provides a vertical gap between an upper surface of the substrate ring and an upper surface of the substrate.

* * * * *